United States Patent
Nakashima et al.

(10) Patent No.: US 10,807,352 B2
(45) Date of Patent: Oct. 20, 2020

(54) METHOD FOR PRODUCING METAL-CLAD LAMINATE, AND METAL-CLAD LAMINATE

(71) Applicant: KURARAY CO., LTD., Kurashiki-shi (JP)

(72) Inventors: Takahiro Nakashima, Kamisu (JP); Takeshi Takahashi, Kamisu (JP); Minoru Onodera, Saijo (JP)

(73) Assignee: KURARAY CO., LTD., Kurashiki-shi (JP)

( * ) Notice: Subject to any disclaimer, the term of this patent is extended or adjusted under 35 U.S.C. 154(b) by 0 days.

(21) Appl. No.: 16/123,876

(22) Filed: Sep. 6, 2018

(65) Prior Publication Data
US 2019/0001628 A1 Jan. 3, 2019

Related U.S. Application Data

(63) Continuation of application No. PCT/JP2017/008678, filed on Mar. 6, 2017.

(30) Foreign Application Priority Data

Mar. 8, 2016 (JP) ................................. 2016-044549

(51) Int. Cl.
*B32B 15/08* (2006.01)
*B32B 37/06* (2006.01)
(Continued)

(52) U.S. Cl.
CPC .......... *B32B 38/0036* (2013.01); *B29C 65/02* (2013.01); *B32B 15/08* (2013.01);
(Continued)

(58) Field of Classification Search
None
See application file for complete search history.

(56) References Cited

U.S. PATENT DOCUMENTS

| 6,274,242 B1 * | 8/2001 | Onodera | ................. B32B 27/28 428/411.1 |
| 6,334,922 B1 * | 1/2002 | Tanaka | .................... B32B 15/08 156/234 |

(Continued)

FOREIGN PATENT DOCUMENTS

| CN | 1232860 A | 10/1999 |
| EP | 0 951 206 A2 | 10/1999 |

(Continued)

OTHER PUBLICATIONS

Machine Translation of WO-2005037538-A1, Apr. 2005 (Year: 2005).*

(Continued)

*Primary Examiner* — Jeffrey A Vonch
(74) *Attorney, Agent, or Firm* — Oblon, McClelland, Maier & Neustadt, L.L.P.

(57) ABSTRACT

Provided is a method for producing a metal-clad laminate of a thermoplastic liquid crystal polymer film (TLCP film) and a metal sheet(s) bonded to at least one surface of the film using roll-to-roll processing. The metal sheet has a surface with a ten-point average roughness (Rz) of 5.0 μm or less to be bonded to the TLCP film. The method includes preparing the laminate, dry-treating the laminate by subjecting the laminate passed through a dry zone satisfying the following conditions (1) and (2):
  (1) a drying temperature of lower than the melting point of the TLCP film,
  (2) for a drying period of 10 seconds or longer, and
heat-treating the dried laminate by subjecting the laminate passed through a heating zone on a temperature condition of not lower than the melting point of the TLCP film successively after the dry treatment.

11 Claims, 1 Drawing Sheet

US 10,807,352 B2
Page 2

(51) Int. Cl.
| | |
|---|---|
| B32B 38/00 | (2006.01) |
| H05K 1/03 | (2006.01) |
| H05K 3/02 | (2006.01) |
| H05K 3/38 | (2006.01) |
| B29C 65/02 | (2006.01) |
| B32B 37/20 | (2006.01) |
| B32B 37/00 | (2006.01) |
| B32B 15/20 | (2006.01) |
| B32B 37/10 | (2006.01) |
| B29C 65/00 | (2006.01) |
| B32B 15/09 | (2006.01) |
| C08G 63/06 | (2006.01) |
| C08J 5/18 | (2006.01) |

(52) U.S. Cl.
CPC ............ *B32B 15/20* (2013.01); *B32B 37/003* (2013.01); *B32B 37/06* (2013.01); *B32B 37/10* (2013.01); *B32B 37/203* (2013.01); *H05K 3/022* (2013.01); *H05K 3/38* (2013.01); *H05K 3/381* (2013.01); *H05K 3/382* (2013.01); *B29C 66/742* (2013.01); *B32B 15/09* (2013.01); *B32B 37/0053* (2013.01); *B32B 2038/0048* (2013.01); *B32B 2305/55* (2013.01); *B32B 2307/514* (2013.01); *B32B 2307/538* (2013.01); *B32B 2307/732* (2013.01); *B32B 2457/08* (2013.01); *C08G 63/065* (2013.01); *C08J 5/18* (2013.01); *C08J 2367/04* (2013.01); *H05K 1/03* (2013.01); *H05K 1/0313* (2013.01); *H05K 1/0326* (2013.01); *H05K 1/0346* (2013.01); *H05K 2201/0129* (2013.01); *H05K 2201/0141* (2013.01); *H05K 2201/0355* (2013.01); *H05K 2203/0143* (2013.01); *H05K 2203/068* (2013.01)

(56) References Cited

U.S. PATENT DOCUMENTS

| | | | | | |
|---|---|---|---|---|---|
| 6,616,796 | B1 * | 9/2003 | Onodera | ................. | B32B 15/08 156/164 |
| 7,811,408 | B2 | 10/2010 | Onodera et al. | | |
| 9,096,049 | B2 | 8/2015 | Onodera et al. | | |
| 2002/0170939 | A1 * | 11/2002 | Onodera | ................. | H05K 3/022 228/58 |
| 2003/0147227 | A1 * | 8/2003 | Egitto | ............... | H01L 23/49822 361/795 |
| 2004/0012754 | A1 * | 1/2004 | Matsuno | ................. | B29C 55/18 349/187 |
| 2004/0191560 | A1 * | 9/2004 | Matsuda | ............... | C25D 7/0614 428/626 |
| 2005/0067739 | A1 * | 3/2005 | Onodera | ............... | H05K 3/0011 264/345 |
| 2005/0132566 | A1 * | 6/2005 | Roseen, Jr. | .......... | H05K 3/4626 29/831 |
| 2006/0124228 | A1 * | 6/2006 | Lee | ........................ | H05K 3/022 156/199 |
| 2006/0257622 | A1 * | 11/2006 | Shin | ................... | B32B 37/0038 428/137 |
| 2007/0026245 | A1 * | 2/2007 | Okamoto | ................. | B32B 27/36 428/458 |
| 2008/0107833 | A1 * | 5/2008 | Onodera | ........... | B29C 66/91935 428/1.6 |
| 2009/0065240 | A1 * | 3/2009 | Onodera | ................. | B32B 27/36 174/252 |
| 2010/0203326 | A1 * | 8/2010 | Ok | ........................ | C08G 69/44 428/337 |
| 2010/0236820 | A1 * | 9/2010 | Suh | ........................ | B32B 5/022 174/258 |
| 2010/0323210 | A1 | 12/2010 | Onodera et al. | | |
| 2012/0205146 | A1 * | 8/2012 | Oguro | ..................... | C25D 5/10 174/257 |
| 2013/0101824 | A1 * | 4/2013 | Shim | ........................ | B32B 5/26 428/221 |
| 2014/0023881 | A1 * | 1/2014 | Sakaguchi | .............. | B32B 15/08 428/621 |
| 2014/0231123 | A1 * | 8/2014 | Onodera | ................. | B32B 27/34 174/255 |
| 2016/0212845 | A1 * | 7/2016 | Nakashima | ............. | B32B 15/20 |
| 2016/0236402 | A1 * | 8/2016 | Nakashima | ............. | H05K 1/032 |
| 2017/0196083 | A1 * | 7/2017 | Miki | ..................... | C25D 11/38 |
| 2017/0238428 | A1 * | 8/2017 | Takahashi | ............... | B32B 15/08 174/251 |
| 2017/0318670 | A1 * | 11/2017 | Tachibana | ................. | B32B 7/04 |
| 2018/0134025 | A1 * | 5/2018 | Nakashima | ......... | B32B 38/0036 |
| 2019/0134951 | A1 * | 5/2019 | Koyama | ................. | B32B 15/08 |

FOREIGN PATENT DOCUMENTS

| | | | | | |
|---|---|---|---|---|---|
| JP | 60-248344 | | 12/1985 | | |
| JP | 4-53739 | | 2/1992 | | |
| JP | 11-291350 | | 10/1999 | | |
| JP | 2000-44797 | | 2/2000 | | |
| JP | 2000-343610 | | 12/2000 | | |
| JP | 2004322523 | A | * | 11/2004 | |
| JP | 2005305734 | A | * | 11/2005 | |
| JP | 2007190906 | A | * | 8/2007 | |
| JP | 2007-268716 | | 10/2007 | | |
| JP | 2007268716 | A | * | 10/2007 | |
| JP | 2008-229995 | | 10/2008 | | |
| JP | 2008229995 | A | * | 10/2008 | |
| JP | 2009262531 | A | * | 11/2009 | |
| JP | 2010000795 | A | * | 1/2010 | |
| JP | 2010103269 | A | * | 5/2010 | |
| JP | 2010221694 | A | * | 10/2010 | |
| JP | 2014233891 | A | * | 12/2014 | |
| JP | 2016-107507 | | 6/2016 | | |
| TW | 436510 | B | | 5/2001 | |
| WO | WO-2005037538 | A1 | * | 4/2005 | ........... H05K 1/0313 |
| WO | WO 2006/051693 | A1 | | 5/2006 | |
| WO | WO 2016/114262 | A1 | | 7/2016 | |
| WO | WO-2016114262 | A1 | * | 7/2016 | ............. B32B 15/08 |
| WO | WO 2016/170779 | A1 | | 10/2016 | |

OTHER PUBLICATIONS

Machine Translation of JP-2007268716-A, Oct. 2007 (Year: 2007).*
Machine Translation of JP-2008229995-A, Oct. 2008 (Year: 2008).*
Machine Translation of JP-2010000795-A, Jan. 2010 (Year: 2010).*
Extended European Search Report dated Oct. 1, 2019 in Patent Application No. 17763151.2, citing document AO therein, 5 pages.
International Search Report dated Apr. 25, 2017 in PCT/JP2017/008678, filed on Mar. 6, 2017.
Combined Chinese Office Action and Search Report dated Nov. 27, 2019, in Patent Application No. 201780015980.4, citing document AO therein, 15 pages (with unedited computer generated English translation).
Office Action dated Jul. 24, 2020, in Chinese Patent Application No. 201780015980.4 (w/ Computer-generated English translation thereof).
Office Action dated Aug. 5, 2020 in Taiwan Patent Application No. 106107322 (w/ computer-generated English translation).

* cited by examiner

METHOD FOR PRODUCING METAL-CLAD LAMINATE, AND METAL-CLAD LAMINATE

CROSS REFERENCE TO THE RELATED APPLICATION

This application is a continuation application, under 35 U.S.C § 111(a) of international application No. PCT/JP2017/008678, filed Mar. 6, 2017, which claims priority to Japanese patent application No. 2016-044549, filed Mar. 8, 2016, the entire disclosure of which is herein incorporated by reference as a part of this application.

FIELD OF THE INVENTION

The present invention relates to a method for producing a metal-clad laminate comprising a film of thermoplastic liquid crystal polymer capable of forming an optically anisotropic melt phase (hereinafter, the film and the polymer may be referred to as thermoplastic liquid crystal polymer film and thermoplastic liquid crystal polymer, respectively).

BACKGROUND ART

Conventionally, since metal-clad laminates comprising thermoplastic liquid crystal polymer films are excellent in low hygroscopicity, heat resistance, chemical resistance, and electric properties as well as excellent dimensional stability derived from natures of the thermoplastic liquid crystal polymer films, the metal-clad laminates are used as materials for circuit boards, such as flexible wiring boards and circuit boards for semiconductor mounting.

Patent Document 1 (JP Laid-open Patent Publication No. 2007-268716) discloses a method for producing a laminate by laminating a metal foil on a film of a liquid crystal polymer forming an optically anisotropic melt phase, the method comprising a first process of laminating the film and the metal foil by thermo-compression to form a windable/conveyable laminate, a second process of heat-treating the laminate at a temperature lower by 10° C. than the melting point of the liquid crystal polymer or higher while conveying, wherein the temperature distribution from 200° C. to the maximum temperature during raising the temperature of the laminate in the conveyance region is adjusted within ±5° C. in each position in the width direction. The document describes that the production method achieves production of the laminate with suppressed size variation.

SUMMARY OF THE INVENTION

Lately due to popularization of highly efficient performance electronic equipment, such as a smart phone, densification of parts as well as improvement in electronic equipment performance have progressed. As a result, there have been demands on metal-clad laminates that excel in adhesion strength between a thermoplastic liquid crystal polymer film and a metal sheet, while being capable of respond to high frequency of transmission signals (that is, high frequency characteristic).

The high frequency characteristic i.e., insertion loss, of the metal sheet used for a transmission line is dependent on a skin effect (surface resistance). Accordingly, the high frequency characteristic of metal sheet is dependent on surface shape, especially the surface roughness (ten-point average roughness: Rz) of the metal sheet. The metal sheet with high roughness as well as large Rz has large insertion loss, resulting in deterioration in high frequency characteristics, while the metal sheet with low roughness and small Rz has small insertion loss, resulting in improvement in high frequency characteristics. Therefore, metal sheets with low roughness and small surface roughness Rz are desirable.

However, if the metal sheet with low roughness is used from the viewpoint of reducing resistance due to skin effect to make insertion loss small, adhesion strength of metal sheet and thermoplastic liquid crystal polymer film becomes insufficient. In order to satisfy both small insertion loss and improved adhesion strength, various trials have been made, but still sufficient solution has not been obtained yet.

Patent Document 1 describes improvement in dimensional stability by adjusting temperature conditions into a specific one at the time of lamination of liquid crystal polymer film with metal foil, but is silent on temperature conditions for raising adhesive strength, in particular about the technique, which raises adhesive strength of metal foil with low roughness.

An object of the present invention is to provide a production method of a metal-clad laminate satisfying high frequency characteristics, having improved adhesion strength between thermoplastic liquid crystal polymer film and metal sheet, and suppressing blister generation.

Inventors of the present application found out that even if a metal sheet with low roughness is used, where the metal sheet is laminated onto a thermoplastic liquid crystal polymer film by thermo-compression bonding to form a laminate, and the laminate is further heat-treated at a temperature higher than the melting point of the thermoplastic liquid crystal polymer film, the adhesion strength of the metal sheet with the thermoplastic liquid crystal polymer film enhanced. However, such a laminate had problems such that where the laminate is heated with rapid temperature rise to a temperature higher than the melting point of the thermoplastic liquid crystal polymer film, blisters were generated due to expansion of volatilization components, such as water included in the film, so as to make the appearance of the laminate poor.

In order to solve the above problems, the inventors of the present application have made further extensive investigations and have finally found out that by carrying out drying process at specific temperature and time conditions after laminating a metal sheet and a thermoplastic liquid crystal polymer film by thermo-compression bonding to form a laminate, and then heat-treating the laminate at a temperature higher than the melting point of the thermoplastic liquid crystal polymer film, even if a metal sheet with low roughness is used to laminate to a thermoplastic liquid crystal polymer film, the resultant laminate suppresses blister generation as well as enhances adhesion strength between the thermoplastic liquid crystal polymer film and the metal sheet, and finally have completed the present invention.

That is, an aspect of the present invention is a method for producing a thermoplastic liquid crystal polymer film and a metal sheet(s) bonded to at least one surface of the thermoplastic liquid crystal polymer film, comprising laminating the thermoplastic liquid crystal polymer film and the metal sheet to form a laminate, and heat-treating the laminate at a temperature of equal to or higher than the melting point of the thermoplastic liquid crystal polymer film, wherein before heat-treating, the laminate is subjected to dry treatment satisfying the following conditions (1) and (2): (1) the temperature in the dry treatment is lower than the melting point of the thermoplastic liquid crystal polymer film; and (2) the drying period is 10 seconds or longer.

Moreover, according to the above method of the present invention aspect, the metal sheet may be a metal sheet with low roughness, for example, a metal sheet having a surface with a ten-point average roughness (Rz) of 2.0 μm or less on the side in contact with the thermoplastic liquid crystal polymer film.

Further, the present invention may comprise following aspects.

Aspect 1

A method for producing a metal-clad laminate using roll-to-roll processing, the metal-clad laminate comprising a film of a thermoplastic polymer being capable of forming an optically anisotropic melt phase (hereinafter may be referred to as "a thermoplastic liquid crystal polymer film") and a metal sheet(s) bonded to at least one surface of the thermoplastic liquid crystal polymer film, the metal sheet having a surface with a ten-point average roughness (Rz) of 5.0 μm or less (preferably 2.0 μm or less) to be bonded to the thermoplastic liquid crystal polymer film, the method at least comprising:

preparing the laminate comprising the metal sheet(s) bonded to the thermoplastic liquid crystal polymer film, dry-treating the laminate by subjecting the laminate passed through a dry zone satisfying the following conditions (1) and (2): (1) the dry treatment is carried out at a drying temperature of lower than the melting point (Tm) of the thermoplastic liquid crystal polymer film, for example, a temperature of equal to or lower than Tm−5° C., and preferably a temperature equal to or lower than Tm−15° C.), (2) the dry treatment is carried out for a drying period of 10 seconds or longer (preferably about from 10 to 300 seconds, more preferably about from 30 to 200 seconds, and still more preferably about from 60 to 150 seconds); and heat-treating the dried laminate by subjecting the laminate passed through a heating zone on a temperature condition of not lower than the melting point of the thermoplastic liquid crystal polymer film (preferably not lower than Tm+1° C. and lower than Tm+50° C., more preferably in a range from Tm+1° C. to Tm+30° C., and still more preferably in a range from Tm+2° C. to Tm+20° C. successively after the dry treatment.

Aspect 2

The production method according to aspect 1, wherein the metal sheet has a surface with a ten-point average roughness (Rz) of 2.0 μm or less (preferably from 0.1 to 1.5 μm and more preferably from 0.3 to 1.1 μm) on the side in contact with the thermoplastic liquid crystal polymer film.

Aspect 3

The production method according to aspect 1 or 2, wherein a value obtained by multiplying the drying temperature (° C.) and drying time (second) is from 1400 to 30000 (preferably from 1600 to 30000, and more preferably from 2000 to 30000).

Aspect 4

The production method according to any one of aspects 1 to 3, wherein a heating rate of the thermoplastic liquid crystal polymer film surface in the heat treatment is in a range of from 3 to 80° C./second (preferably 5 to 70° C./second).

Aspect 5

The production method according to any one of aspects 1 to 4, wherein a drying temperature in the dry treatment is in a range from 140° C. to Tm−5° C., and a heating temperature in the heat treatment is in a range of from Tm+1° C. to Tm+30° C. where Tm refers to the melting point Tm (° C.) of the thermoplastic liquid crystal polymer film.

Aspect 6

The production method according to any one of aspects 1 to 4, wherein a heating temperature in the heat treatment is in a range of Tm+11° C. or higher where Tm refers to the melting point Tm (° C.) of the thermoplastic liquid crystal polymer film.

Aspect 7

The production method according to any one of aspects 1 to 6, wherein the thermoplastic liquid crystal polymer film has a thickness in a range of from 10 to 500 μm (preferably from 15 to 200 μm, and more preferably from 20 to 150 μm), and the metal sheet has a thickness in a range of from 6 to 200 μm (preferably from 9 to 40 μm, and more preferably from 10 to 20 μm).

Aspect 8

The production method according to any one of aspects 1 to 7, wherein a ratio of the thickness (μm) relative to the surface roughness (μm) of the metal sheet is (thickness)/(surface roughness)=200/1 to 50/1.

Aspect 9

A metal-clad laminate comprising a thermoplastic liquid crystal polymer film and a metal sheet(s) bonded to at least one surface of the thermoplastic liquid crystal polymer film, wherein the metal sheet has a surface with a ten-point average roughness (Rz) of 5.0 μm or less to be bonded to the thermoplastic liquid crystal polymer film; a peel strength of the thermoplastic liquid crystal polymer film from the metal sheet bonded to the thermoplastic liquid crystal polymer film is 0.7 kN/m or greater; and an average number of blisters generated per 1 $m^2$ is 20 or less.

Aspect 10

The metal-clad laminate according to aspect 9, wherein the metal sheet has a surface with a ten-point average roughness (Rz) of 2.0 μm or less to be bonded to the thermoplastic liquid crystal polymer film.

Aspect 11

The metal-clad laminate according to aspect 9 or 10, wherein the thermoplastic liquid crystal polymer film has a thickness in a range of from 10 to 500 μm (preferably from 15 to 200 μm, and more preferably from 20 to 150 μm), and the metal sheet has a single layer thickness in a range of from 6 to 200 μm (preferably from 9 to 40 μm, and more preferably from 10 to 20 μm).

According to the present invention, it is possible to provide the metal-clad laminate having high frequency characteristics, being excellent in adhesion strength, and inhibiting blister generation. Further, such a metal-clad laminate can be produced in an efficient way.

DESCRIPTION OF THE EMBODIMENTS

Hereinafter, one embodiment of the present invention is described in detail based on drawings. The present invention is not limited to the following embodiments.

Figure 1:
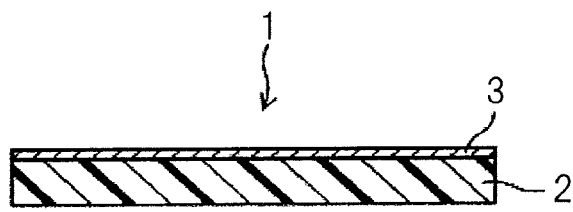
FIG. 1 is a sectional view showing the structure of the metal-clad laminate according to one embodiment of the present invention.

FIG. 1 is a sectional view showing the structure of the metal-clad laminate according to an embodiment of the present invention.

As shown in FIG. 1, the metal-clad laminate 1 of this embodiment comprises a thermoplastic liquid crystal polymer film 2 and a metal sheet 3 (hereinafter may be sometimes referred to as metal foil) laminated on one side of the thermoplastic liquid crystal polymer film 2.

Metal Foil

There is no specific restriction of a material of the metal foil 3 used in the present invention, and examples of the material may include copper, gold, silver, nickel, aluminum, stainless steel, and others. It is preferred to use copper foil and stainless steel foil from viewpoints of conductivity, handling nature, cost, and so on. The copper foil may be produced by rolling method (rolled copper foil) or electrolyzing method (electrolyzed copper foil).

The metal foil 3 may be subjected to chemical treatments, such as acid cleaning, which are usually performed for copper foils.

The metal foil 3 preferably has a thickness in a range of 6 μm or thicker and 200 μm or thinner, more preferably in a range of 9 μm or thicker and 40 μm or thinner, and still more preferably in a range of 10 μm or thicker and 20 μm or thinner.

Where the thickness of the metal foil is too thin, there is a possibility that deformation such as wrinkles may be caused in the metal foil 3 during the manufacturing process of the metal-clad laminate 1. Where the thickness of the metal foil is too thick, for example, it may deteriorate in bending performance used as a flexible wiring board.

According to the present invention, the metal foil 3 has a surface with a small surface roughness (i.e., low roughness) on the side in contact with the thermoplastic liquid crystal polymer film, and may have a surface with a ten-point average roughness Rz of 5.0 μm or less. Even if the metal foil has such a low roughness, since the metal-clad laminate of the present invention is produced by a specific production method, the metal-clad laminate can improve adhesion strength while inhibiting blister generation. The ten-point average roughness Rz may be 0.1 μm or more. In particular, metal foils with the ten-point average roughness Rz of 2.0 μm or less can contribute to obtain the metal-clad laminate 1 having good high frequency characteristic and being excellent in adhesion strength. In particular, in view of the balance of high frequency characteristic and adhesion strength, the ten-point average roughness Rz is in a range of 0.1 μm or more and 1.5 μm or less, and more preferably in a range of 0.3 μm or more and 1.1 μm or less.

The "surface roughness" here means a ten-point average roughness (Rz) obtained by measuring a surface of metal sheet using a contact-type surface roughness tester ("SJ-201" produced by Mitutoyo Corp.), and means the roughness of the surface of metal foil 3 on the side in contact with the thermoplastic liquid crystal polymer film 2.

Measurement of surface roughness was carried out in accordance with a measuring method described in JIS B0601:1994. More precisely, the surface roughness (Rz) is a ten-point average roughness by selecting a sampled standard length along the direction of the average line from a roughness curve, determining sum of the average of the absolute values of the 5 highest peak points (convex top points) and the average of the absolute values of the 5 lowest valley points (concave bottom points) in the sampled section, and is express in μm.

The metal foil preferably has a specific relationship between the thickness and the surface roughness from the point of acquiring good high frequency characteristic. For example, the ratio (unit: μm) of the thickness and surface roughness of metal foil may be about (thickness of metal foil)/(surface roughness)=200/1 to 50/1, and may be preferably about 150/1 to 50/1.

Thermoplastic Liquid Crystal Polymer Film

Although raw materials of the thermoplastic liquid crystal polymer to be used in the present invention is not limited to a specific one, examples of such thermoplastic liquid crystal polymer may include well-known thermotropic liquid crystal polyesters and thermotropic liquid crystal polyester amides, which can be prepared from compounds and the derivatives thereof, classified into the following exemplified compounds (1) to (4). It is, however, to be noted that in order to obtain a polymer capable of forming an optically anisotropic melt phase, various combination of those raw compounds has nevertheless appropriate ranges.

(1) Aromatic or aliphatic dihydroxy compounds. (As for typical examples, see Table 1 below.)

TABLE 1

Chemical formulae of typical examples of aromatic or aliphatic dihydroxy compounds

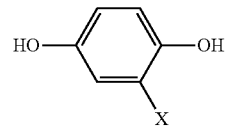

(X is hydrogen or a halogen, or a group such as a lower alkyl or phenyl)

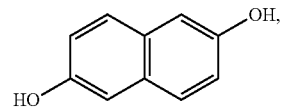

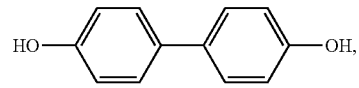 [SMILES: Oc1ccc(-c2ccc(O)cc2)cc1]

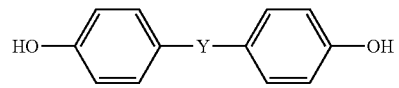

(Y is a group such as

—O—, —CH$_2$— or —S—)

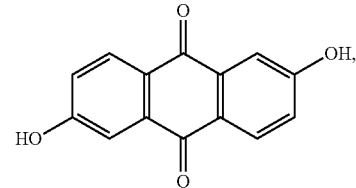 [SMILES: O=C1c2ccc(O)cc2C(=O)c2ccc(O)cc21]

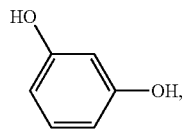

HO(CH$_2$)$_n$OH
(n is an integer of 2 to 12)

(2) Aromatic or aliphatic dicarboxylic acids. (As for typical examples, see Table 2 below.)

TABLE 2

Chemical formulae of typical examples of aromatic or aliphatic dicarboxylic acids

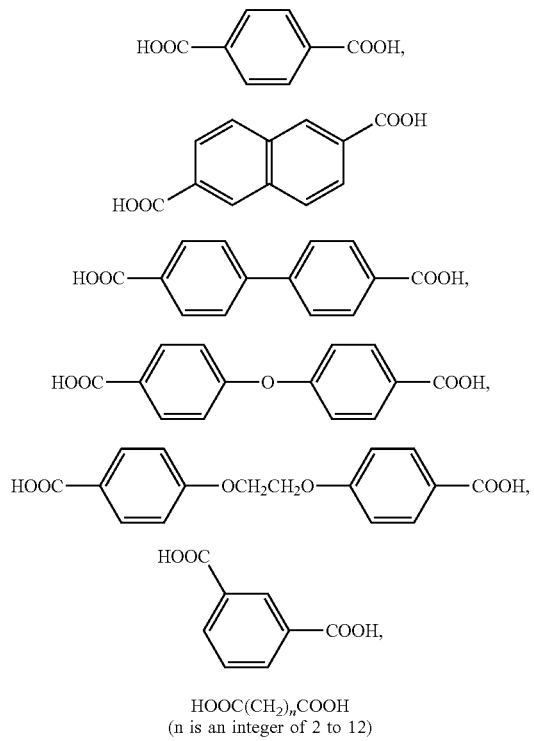

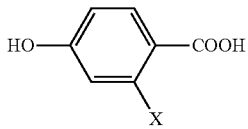

HOOC(CH$_2$)$_n$COOH
(n is an integer of 2 to 12)

(3) Aromatic hydroxycarboxylic acids. (As for typical examples, see Table 3 below.)

TABLE 3

Chemical formulae of typical examples of aromatic hydroxycarboxylic acids

HO—⬡—COOH
          |
          X (X is hydrogen or a halogen, or a group
such as a lower alkyl or phenyl)

TABLE 3-continued

Chemical formulae of typical examples of aromatic hydroxycarboxylic acids

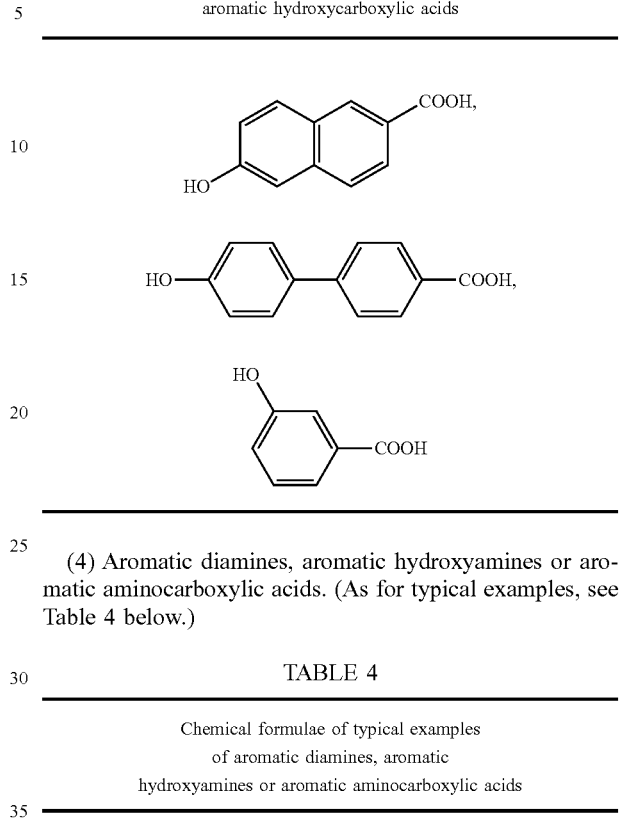

(4) Aromatic diamines, aromatic hydroxyamines or aromatic aminocarboxylic acids. (As for typical examples, see Table 4 below.)

TABLE 4

Chemical formulae of typical examples of aromatic diamines, aromatic hydroxyamines or aromatic aminocarboxylic acids

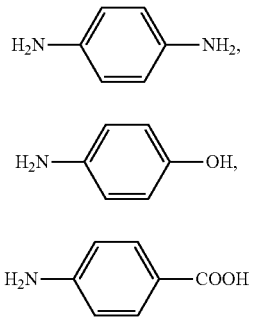

Typical examples of the thermoplastic liquid crystal polymer obtained from these compounds include copolymers (a) to (e) having structural units shown in Table 5.

TABLE 5

Typical examples of thermoplastic liquid crystal polymer (a) 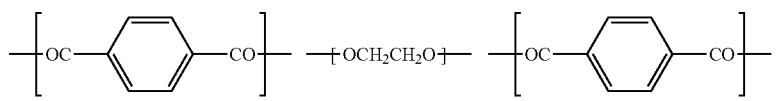

Copolymer

TABLE 5-continued

Typical examples of thermoplastic liquid crystal polymer (b) Copolymer (c) Copolymer (d) Copolymer (e) Copolymer
(Y is a group such as —O—, —CH$_2$— or —S—)

In addition, the thermoplastic liquid crystal polymer used in the present invention has a melting point of preferably in a range of from about 200 to about 400° C. and more preferably in a range of from about 250 to about 350° C. in order to render the resultant film to have a desirable heat resistance and workability. In view of film production efficiency, the preferable polymer has a relatively low melting point.

In the case where the film requires a higher heat resistance and melting point, the heat resistance and melting point of the film can be increased to a desired degree if the resultant film once obtained is subjected to a heat treatment. As one example of the heat treatment, with the film once obtained, which has a melting point of 283° C., the melting point of the film can be increased to 320° C. if such film is heated at 260° C. for 5 hours.

The thermoplastic liquid crystal polymer film 2 used in the present invention can be obtained by extrusion-molding of the above-mentioned thermoplastic liquid crystal polymer. At this time, although any extrusion molding methods can be employed, industrially advantageous one includes T-die film forming and stretching method, laminate stretching method, inflation method and the like. Particularly with the inflation method, stresses can be applied not only in a direction of the mechanical direction of the film (the longitudinal direction of the film referred to above) (which direction is hereinafter referred to as "MD direction"), but also in a direction perpendicular to the MD direction (the transverse direction of the film referred to above) (which direction is hereinafter referred to as "TD direction") and, therefore, it is possible to obtain the film, of which mechanical properties and thermal characteristics in both of the MD direction and the TD direction are well counterbalanced with each other.

The thermoplastic liquid crystal polymer film 2 in this embodiment preferably has a Segment Orientation Ratio SOR in the longitudinal film direction of 0.90 or larger and smaller than 1.50, more preferably 0.95 or larger and 1.15 or smaller, and further preferably 0.97 or larger and 1.15 or smaller.

The thermoplastic liquid crystal polymer film 2 having a molecular orientation level in this range has good balance of the mechanical and thermal properties in the MD direction and the TD direction, so that the film is practicality useful. Further, as mentioned above, the film can make the metal-clad laminate 1 for circuit boards to have good isotropy as well as dimensional stability.

Where the molecular orientation levels SOR are less than 0.90 or 1.50 or more, the orientation of liquid crystal polymer molecules is remarkably biased, resulting in obtaining hard films with easy tear either to the TD or to the MD direction. The thermoplastic liquid crystal polymer films used for circuit boards requiring morphological stability, such as reduced curvature at the time of heating, preferably has a molecular orientation level SOR in a range of 0.90 or more and less than 1.50 as described above. Where in order to achieve no curvature at the time of heating, the film preferably has a molecular orientation level SOR in a range of 0.95 or more and 1.08 or less. Alternatively, a film having a molecular orientation level SOR in a range of 0.90 or more and 1.08 or less can achieve uniform dielectric constant.

Here, the molecular orientation level SOR (Segment Orientation Ratio) is an index descriptive of a degree of molecular orientation, and represents, unlike the conventional MOR (Molecular Orientation Ratio), a value that takes into consideration the thickness of an object.

The molecular orientation level SOR is measured as follows.

Using a conventional microwave molecular orientation degree measuring machine, a liquid crystal polymer film 2 is inserted into a microwave resonance waveguide tube such that a propagation direction of microwave becomes perpendicular to the surface of the film 2, and electric-field strength (microwave transmission intensity) of microwave transmitted through the film is measured.

Then, based on this measured value, m value (referred to as refractive index) is calculated from the following mathematical formula (1):

$$m=(Zo/\Delta z)\times[1-vmax/vo] \quad \text{Mathematical Formula (1)}$$

Here, Zo represents a device constant, $\Delta Z$ represents an average thickness of an object subjected to the measurement, vmax represents the frequency at which the maximum microwave permeability can be obtained when the frequency of the microwave is varied, and vo represents the frequency at which the maximum microwave permeability can be obtained when the average thickness is zero, that is, when no object is present.

Next, when the angle of rotation of the object relative to the direction of oscillation of the microwaves is 0°, that is, when the direction of oscillation of the microwaves is aligned with the direction in which molecules of the object are most oriented and in which the minimum microwave penetration strength is exhibited, an m value obtained in such a case was represented as $m_0$. An m value obtained as $m_{90}$ represents the value of the refractive index when the angle of rotation of the object is 90°. A molecular orientation level SOR is calculated as $m_0/m_{90}$.

The thickness of the thermoplastic liquid crystal polymer film 2 according to the present invention is not limited to the specific range, and may be in a range of from 10 to 500 μm, and more preferably in a range from 15 to 200 μm. Where the metal-clad laminate 1 comprises the thermoplastic liquid crystal polymer film 2 as an electrical insulation material and is used as a printed wiring board, in particular, the thickness of the thermoplastic liquid crystal polymer film 2 may be preferably in a range of from 20 to 150 μm, and more preferably in a range of from 20 to 50 μm.

The film with a too thin thickness has small rigidity and strength. Where electronic parts are mounted on the printed wiring board formed from such a film, the printed wiring board deforms by pressurization, resulting in deterioration in accuracy of wiring position to cause defective product.

As electrical insulation materials of main circuit boards, such as a personal computer, composites of thermoplastic liquid crystal polymer films and other electrical insulation materials, for example, glass substrate, can also be used. The film may comprise additives, such as lubricant and antioxidant. The film may include fillers or may exclude fillers.

Next, the production method of the metal-clad laminate according to an embodiment of the present invention will be described.

The production method of this embodiment is a method of producing a metal-clad laminate comprising a thermoplastic polymer film and a metal sheet(s) bonded on at least one surface of the thermoplastic liquid crystal polymer film using roll-to-roll processing. The metal sheet has low roughness, for example, a ten-point average roughness (Rz) of 5.0 μm or less on the surface in contact with the thermoplastic liquid crystal polymer film. The method comprises preparation process of a laminate of the thermoplastic liquid crystal polymer film and the metal sheet(s) bonded to the film. Although the already produced laminate may be used in this preparation process, it is preferred to laminate (thermo-compression bond) a thermoplastic liquid crystal polymer film 2 and a metal foil(s) 3 to form a laminate. The method comprises at least dry treating the laminate by subjecting the laminate passed through a dry zone in a specific condition, and heat-treating the dried laminate.

<Laminate Formation Process>

First, a long thermoplastic liquid crystal polymer film 2 is subjected to tension, and then the tensed thermoplastic liquid crystal polymer film 2 is overlaid with a long metal foil 3 on one side of the thermoplastic liquid crystal polymer film 2, to laminate them by thermo-compression bonding between heating rolls.

The term "tensed state" here means a state where a tension (for example, from 0.12 to 0.28 kg/mm²) is applied to the film in the longitudinal direction (tensile direction) of the film.

Figure 2:
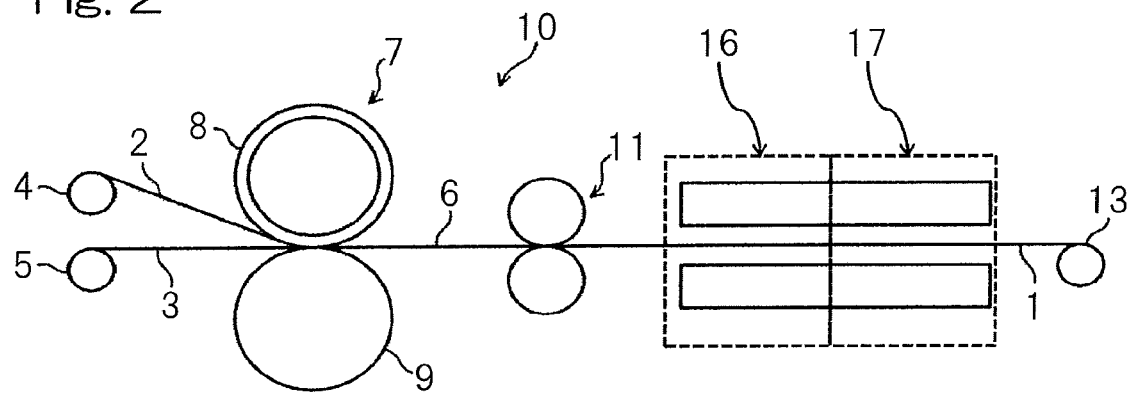
FIG. 2 is a schematic view showing the entire constitution of the continuous heat-press apparatus used in the production method of the metal-clad laminate according to one embodiment of the present invention.

FIG. 2 is a schematic view showing the entire constitution of the continuous heat-press apparatus used in the production method of the metal-clad laminate according to one embodiment of the present invention.

This continuous heat-press apparatus 10 is used for producing a one-sided metal-clad laminate in which the metal foil 3 is bonded to one surface of the thermoplastic liquid crystal polymer film 2. As shown in FIG. 2, the continuous heat-press apparatus 10 is provided with a film unwinding roll 4 for supporting the thermoplastic liquid crystal polymer film, a foil unwinding roll 5 for supporting the metal foil, and heating rolls 7 for thermo-compression bonding of the thermoplastic liquid crystal polymer film 2 and the metal foil 3 to obtain a laminate 6.

Where producing a one-sided metal-clad laminate, for example, the heating rolls 7 may preferably comprise a pair of heat resistant rubber roll 8 and heating metal roll 9 (both have a surface hardness of 80 degrees or higher). It is preferred to set the heat resistant rubber roll 8 on the side of the thermoplastic liquid crystal polymer film 2 and set the heating metal roll 9 on the side of the metal foil 3.

The heat resistant rubber roll 8 used for producing one-sided metal-clad laminate may preferably have a surface hardness of the roll of 80 degrees or higher, more preferably 80 to 95 degrees measured in accordance with the examination by A type spring loaded hardness tester in accordance with JIS K 6301. In this case, where the roll surface is too soft, thermo-compression bonding may be carried out under insufficient pressure, resulting in poor adhesive strength of the laminate 6. Where the roll surface is too hard, a local linear pressure may be applied between the heat resistant rubber roll 8 and the heating metal roll 9, so as to cause poor appearance of the laminate 6. The rubber having a hardness of 80 degrees or higher can be obtained by adding rubber accelerators, such as a vulcanizing agent and an alkaline substance, into synthetic rubbers, such as silicone-based rubber, fluoric rubber, or natural rubber.

As shown in FIG. 1, by conveying a superimposed assembly of the thermoplastic liquid crystal polymer film 2 and the metal foil 3 toward the longitudinal direction of the film, the superimposed assembly is supplied between a pair of the heat resistant rubber roll 8 and the heating metal roll 9, so as to laminate the thermoplastic liquid crystal polymer film 2 and the metal foil 3 by thermo-compression bonding.

From a viewpoint of suppressing excessive film drawing, the conditions for thermo-compression bonding is carried out on the condition that the temperature of the heating roll may be preferably in range of from Tm−40 to Tm−10. From a viewpoint of making the surface smooth, the press pressure may be preferably in range of from 90 kg/cm$^2$ to 250 kg/cm$^2$. From the viewpoint to enhance adhesion strength, the heating may be carried out by heating from the side of the metal foil 3, and the press period may be preferably in range of 0.1 second to 1.5 seconds.

Dry Treatment Process

Next, dry treatment is performed to the obtained laminate 6. As shown in FIG. 2, a continuous heat-press apparatus 10 is provided with a nip roll 11 for conveying the laminate 6, a dry treatment means (dryer) 16 for carrying out dry treatment of the laminate 6, a heat treatment means (heater) 17 for heat treatment of the laminate 6, and a winding roll 13 for winding the heat-treated metal-clad laminate 1.

As far as the laminate 6 can be dried in accordance with the dry treatment conditions of the present invention, dry treatment means 16 is not limited to a specific one, and, for example, may include a hot wind dry oven, a hot wind circulation dryer, a hot roll assembly, a ceramic heater, an IR (far-infrared rays) heat treater, or a method using combination of these devices. From the viewpoint of preventing oxidization of the surface of the metal foil 3, heat treatment is preferably carried out under inactive atmosphere such as oxygen concentration 0.1% or lower, for example, heated nitrogen gas.

Here, the present invention is characterized that the dry treatment temperature is lower than Tm (° C.), and the drying period is 10 seconds or longer where Tm (° C.) refers to the melting point of the thermoplastic liquid crystal polymer film 2.

Where the bonded surface of metal foil is low in roughness, in order to enhance the adhesivity between metal foil and thermoplastic liquid crystal polymer film, it is necessary to carried out the heat treatment higher than the melting point of thermoplastic liquid crystal polymer film as described below. However, the metal-clad laminate produced in such a way may cause blisters in the heat treatment process. By carrying out dry treatment on conditions as described above, probably because volatilization components, inherently contained in the thermoplastic liquid crystal polymer film and possibly attributing to blister generation, are removable, blister generation can be inhibited during the following heat treatment process.

The dry treatment temperature of the present invention is not limited to a specific one as far as the temperature is lower than the melting point (Tm° C.) of thermoplastic liquid crystal polymer film. Since volatilization components can be more significantly removable from the thermoplastic liquid crystal polymer film due to molecule movement activation by heating the film, on the conditions of less than melting-point temperature (Tm° C.), higher dry treatment temperature is preferred. As a range of a preferred dry treatment temperature, there may be described from 100° C. to less than Tm° C., more preferably from 140° C. to Tm−5° C., and still preferably from 200° C. to Tm−15° C. Alternatively, the range of dry treatment temperature may be equal to or higher than Tm−180° C. to lower than Tm° C., preferably equal to or higher than Tm−140° C. to equal to or lower than Tm−5° C., and more preferably equal to or higher than Tm−85° C. to equal to or lower than Tm−15° C. By performing the dry treatment at temperatures with the above ranges, volatile gas originating in a thermoplastic liquid crystal polymer film can be released gradually rather than rapidly so as to inhibit blister generation in the subsequent heat treatment process. The dry treatment temperature referred in the present invention is the temperature of the thermoplastic liquid crystal polymer film surface in the dry treatment process.

The volatilization components including moisture in the film can be more significantly released if the drying period is longer, but from a viewpoint of production efficiency, the drying period may be preferably from 10 seconds to 300 seconds, more preferably from 30 seconds to 200 seconds, and still more preferably from 60 seconds to 150 seconds.

The multiplied value of the dry treatment temperature (° C.) with the drying period (unit: second) may be, for example, from about 1400 to about 30000 from the viewpoint of more effectively removing volatilization components in industrially advantageous way. Preferably, the multiplied value may be 1600 or more, and particularly preferably 2000 or more.

Heat Treatment Process

As far as heat treatment of the laminate 6 can be carried out at a temperature higher than the melting point of the thermoplastic liquid crystal polymer film 2, the heat treatment means 16 is not limited to a specific one, and, for example, may include a hot wind dry oven, a hot wind circulation dryer, a hot roll assembly, a ceramic heater, an IR (far-infrared rays) heat treater, or a method using combination of these devices. From the viewpoint of preventing oxidization of the surface of the metal foil 3, heat treatment is preferably carried out under inactive atmosphere such as oxygen concentration 0.1% or lower, for example, with heated nitrogen gas. The heat treatment process may be successively performed after the dry treatment, in the same heating oven used in the dry treatment. In that case, in order to performing thermal control in an easier way, the dry treatment and the heat treatment process may be carried out using IR (far-infrared rays) thermal treatment equipment.

Moreover according to the present invention, in the heat treatment performed after the dry treatment, it is important that the heat treatment is carried out at a temperature of Ta (° C.) higher than the temperature of the melting point Tm (° C.) of the thermoplastic liquid crystal polymer film where Ta (° C.) is a heat treatment temperature. Where the heat treatment temperature Ta (° C.) is lower than the melting point Tm (° C.) of the thermoplastic liquid crystal polymer film, sufficient adhesion strength is not obtained between a metal sheet, particularly a metal sheet with low roughness, and a thermoplastic liquid crystal polymer film. The heat treatment temperature Ta (° C.) is preferably equal to or higher than Tm+1 (° C.) and lower than Tm+50° C., more preferably equal to or higher than Tm+1 (° C.) and equal to or lower than Tm+30° C., and still more preferably equal to or higher than Tm+2 (° C.) and equal to or lower than Tm+20° C. In view of improving meltability of thermoplastic liquid crystal polymer film, the heat treatment temperature Ta may be equal to or higher than Tm+11° C. (for example, equal to or higher than Tm+11° C. and equal to or lower than Tm+50° C.).

The heat treatment period may be from 1 second to 10 minutes, more preferably from 5 seconds to 8 minutes, still more preferably from 8 seconds to 5 minutes, and particularly preferably from 8 seconds to 3 minutes. The heat treatment temperature according to the present invention is the temperature of the thermoplastic liquid crystal polymer film surface in the heat treatment process.

Even if the metal foil with low roughness is used, by carrying out such heat treatment to the laminate 6, adhesion strength between the metal foil and the thermoplastic liquid crystal polymer film can be enhanced. In particular, the heat treatment can improve adhesion strength between the thermoplastic liquid crystal polymer film and the metal foil with a surface roughness Rz of 2.0 μm or lower excellent in high frequency characteristic.

As a reason why the heat treatment can improve adhesion strength between metal foil with low roughness and thermoplastic liquid crystal polymer film, it may be assumed that, in general, where a thermoplastic liquid crystal polymer film is bonded to a metal foil by thermo-compression, the surface of the thermoplastic liquid crystal polymer film comes to be molten by the pressure applied during thermo-compression bonding so as to cause molecular orientation called as a skin layer on the surface of the film. Compared with the structure of the core layer inside the film, the skin layer tears easily and is also different in crystal structure. Accordingly, it is presumed that the interface of the core layer and the skin layer becomes weaken, and the skin layer may cause reduced adhesion strength between the thermoplastic liquid crystal polymer film and the metal foil.

However, in the embodiment, since the thermoplastic liquid crystal polymer film 2 and the metal foil 3 is bonded by thermo-compression to obtain a laminate, followed by heat treatment of the laminate under released pressure at a temperature equal to or higher than the melting point of the thermoplastic liquid crystal polymer film 2, it is presumed that even if the skin layer is formed, the molecular orientation specific to the skin layer has disappeared (that is, the factor that reduces adhesion strength has disappeared) so as to improve the adhesion strength.

It is preferred that the disappearance effect of the orientation in the skin layer becomes more remarkable by setting the heat treatment temperature Ta to a temperature higher than the melting point Tm of the thermoplastic liquid crystal polymer film 2.

It should be noted that the skin layer according to the present invention means a layer observed on the surface of a thermoplastic liquid crystal polymer film, the layer with domain structures different from those in the core layer, as well as with un-uniformed (various) domain structures in a thickness direction. The skin layer on the film surface is observed as follows: after grinding a cross-sectional surface of the metal-clad laminate 1 by a crossing section polisher, the cross-sectional surface is etched with propylamine solution to emphasize domain structure, and then observation is carried out by using an electron microscope (SEM).

According to the present invention, it is important to carry out dry treatment to a laminate in accordance with the conditions of the present invention before the heat treatment. By performing the specific dry treatment at a temperature and in a period described in the present invention before heat treatment, it is possible to suppress blister generation probably because volatilization components contained in the thermoplastic liquid crystal polymer film to be used for laminate are gradually removed from the surfaces or the sides of the film without rapid expansion.

Where the dry treatment temperature is lower than the melting point, the thermoplastic liquid crystal polymer film to form a laminate is not molten, so that the volatilization components contained in the film do not cause expansion of the film, and blister generation is suppressed. Further, as the drying period is in a range defined in the present invention, it is possible to gradually remove volatilization components, such as moisture, from the film surfaces as well as the sides. Where dry treatment temperature is equal to or higher than the melting point, the temperature of the laminate becomes equal to or higher than the melting temperature within a time substantially less than 10 seconds. Where the laminate is heated to a temperature equal to or higher than the melting temperature, for example in 2 to 3 seconds, the thermoplastic liquid crystal polymer film becomes molten still containing the volatilization components in the film, so that the volatilization components in the film cause expansion so as to generate blisters in the film.

By performing dry treatment in accordance with the conditions defined in the present invention, even if rapid temperature increase in heat treatment (for example, elevated temperature rate of the thermoplastic liquid crystal polymer film surface is from 3 to 80° C./second, preferably from 5 to 70/second) is carried out in order to improve the adhesiveness between the thermoplastic liquid crystal polymer film and the metal foil in the subsequent heat treatment process, it is possible to suppress blister generation in the film.

According to the present invention, where a double-sided metal-clad laminate is produced, metal sheets are bonded to opposed surfaces of a thermoplastic liquid crystal polymer film to obtain a laminate, and then the laminate may be subjected to the dry treatment and subsequent heat treatment of the present invention. Alternatively, after bonding a metal sheet to one surface of a thermoplastic liquid crystal polymer film to obtain a laminate, the laminate may be subjected to dry treatment described in the present invention to form a one-sided metal-clad laminate, and then another metal sheet is bonded to the opposite surface (film surface) of the metal sheet of the one-sided metal-clad laminate, followed by the heat treatment according to the present invention.

The embodiment may be modified as follows.

Figure 3:
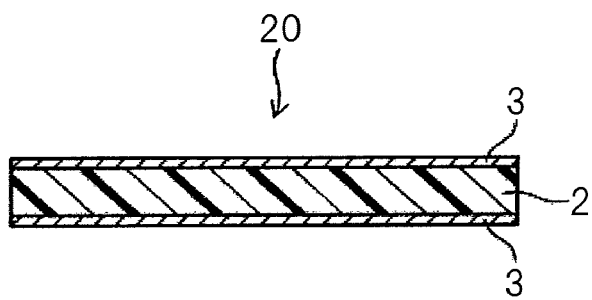
FIG. 3 is a sectional view showing the structure of the metal-clad laminate according to another embodiment of the present invention.

The above embodiment describes, as an example, the metal-clad laminate 1 in which the metal foil 3 is laminated on one surface of the thermoplastic liquid crystal polymer film 2. The present invention is also applicable to the metal-clad laminate 1 in which each of the metal foils 3 is bonded to opposed surfaces of the thermoplastic liquid crystal polymer film 2 as shown in FIG. 3. That is, the present invention is applicable to the metal-clad laminate in which the metal foil 3 is bonded to at least one surface of the thermoplastic liquid crystal polymer film 2.

Figure 4:
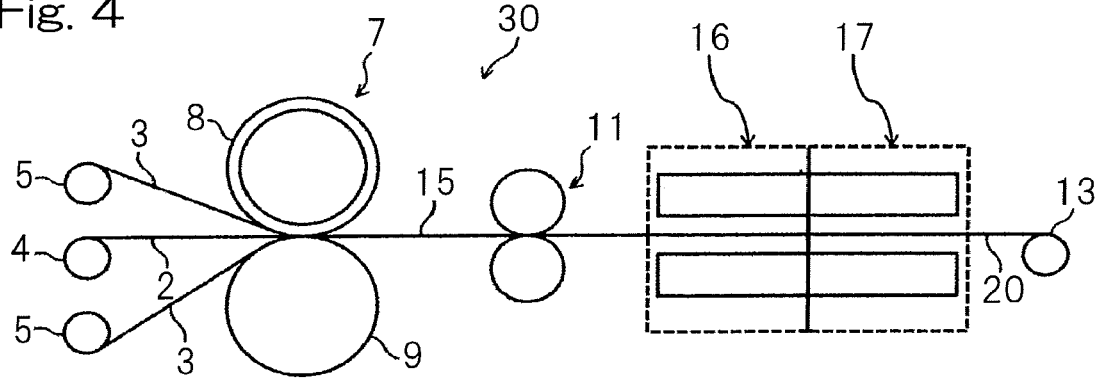
FIG. 4 is a schematic view showing the entire constitution of the continuous heat-press apparatus used in the production method of the metal-clad laminate according to another embodiment of the present invention.

In this case, as shown in FIG. 4, a continuous heat-press apparatus 30 further comprises an unwinding roll 5 for supporting the metal foil 3 such as roll-shaped copper foil (that is, the heat-press apparatus has the two unwinding rolls 5) in addition to the continuous heat-press apparatus 10 as shown in FIG. 2.

In the same way as the above embodiment, first, a long thermoplastic liquid crystal polymer film 2 in a tention-applied state is overlaid with long metal foils 3 on opposed surfaces of the thermoplastic liquid crystal polymer film 2, to bond them by thermo-compression bonding between heating rolls 7 to obtain a laminate 15. Next, the obtained laminate 15 is subjected to the dry treatment and heat treatment of the present invention so as to produce a metal-clad laminate 20.

Further, the metal-clad laminate concerning one embodiment of the present invention is explained. A metal-clad laminate of this embodiment is a metal-clad laminate in which a metal sheet is laminated to at least one surface of a thermoplastic liquid crystal polymer film. From the viewpoint of improvement in high frequency characteristic of the metal sheet, the metal sheet has a ten-point average roughness (Rz) of 5.0 µm or less on the surface in contact with the thermoplastic liquid crystal polymer film. Nevertheless, the metal-clad laminate has good adhesion between layers, and also inhibits generation of blisters in the metal-clad laminate.

Since the metal-clad laminate has good interlayer adhesion, the peel strength of the thermoplastic liquid crystal polymer film from the metal sheet bonded to the thermoplastic liquid crystal polymer film is, for example, 0.7 kN/m or greater (for example, from 0.7 to 2 kN/m), and preferably 0.8 kN/m or greater, and more preferably 0.9 kN/m or greater. The peel strength shows the value measured by the method described in Examples described below.

Moreover, even if the laminate is subjected to heat treatment at a temperature above the melting point of the liquid crystal polymer film in order to enhance adhesiveness of the film, since blister generation can be suppressed, the average number of blisters generated per 1 m² is 20 or less. The average number of blisters generated per 1 m² is preferably 10 or less, and more preferably 5 or less. Here, the blisters can be recognized as extremely small expansions on the surface of the laminate (from 5 to 10 µm in height, and from 200 to 500 µm in diameter), and can be determined as the number of independent blisters. It should be noted that the average number of blisters could be determined by measuring the number of generated blisters in 10 m² on the film surface area so as to calculate as an average equivalent per 1 m² of the film surface area.

In addition, even after lamination, each of the liquid crystal polymer film and the metal sheet has the features described above in the liquid crystal polymer film and metal foil sections. For example, the metal sheet preferably has a ten-point average roughness (Rz) of 2.0 µm or smaller on the surface in contact with the thermoplastic liquid crystal polymer film. Moreover, the thermoplastic liquid crystal polymer film may have a thickness in a range of from 20 to 150 µm; the metal sheet may have a thickness per single layer in a range of from 6 to 200 µm.

EXAMPLES

Hereinafter, the present invention will be described by explaining Examples concretely, but the scope of the present invention is not limited at all by these Examples. Evaluation of the copper-clad laminate in Examples and Comparative Examples was performed by the following methods.

Evaluation of Blister Generation

A surface (10 m²) of a one-sided metal-clad laminate after heat treatment was observed by using a camera (produced by MEC CO., LTD. "LSC-6000") set on the side of liquid crystal polymer film to detect difference in brightness by reflection of the film surface from a light source, followed by image processing so as to count the number of blisters. In the case of a double-sided metal-clad laminate, image processing was carried out by using the camera set on either side of the metal layer to detect difference in brightness by reflection of the metal surface from a light source to measure the number of blisters. The average number of blisters generated per 1 m² of film surface was calculated from the number of counted blisters.

Evaluation of Adhesion

Subsequently, a test sample with 1.0 cm width was obtained from each of the produced metal-clad laminates and fixed to a plane plate by adhering the thermoplastic liquid crystal polymer film side of the sample with double-sided adhesive tape. The metal foil was removed at a rate of 50 mm/minute from the film layer following to the 180° C. method of JIS C 5016 to measure a peeling strength (kN/m).

Since peel strength of 0.7 kN/m or higher is required from the viewpoint of bending resistance, etc., laminates with peeling strength of 0.7 kN/m or higher were determined as having good adhesion strength, and those with peeling strength of less than 0.7 kN/m as having poor adhesion strength. The obtained results are shown in Table 6.

Measurement of Insertion Loss

Further, insertion loss of each of the produced metal-clad laminates was determined. By using a microwave network analyzer ("8722ES" produced by Agilent Technologies Inc.) and a probe ("ACP40-250" produced by Cascade Microtech Inc.), insertion loss was measured at 40 GHz.

Reference Example 1

(1) A thermotropic liquid polyester of 27 mol % 6-hydroxy-2-naphthoic acid unit and 73 mol % p-hydroxybenzoic acid unit was melted and kneaded at 280 to 300° C. using a single axis extruder, and extruded from an inflation die with 40 mm in diameter and a slit interval of 0.6 mm to obtain a thermoplastic liquid crystal polymer film 2 with 50 µm in thickness. The melting point Tm and the heat deformation temperature Tdef of this film were 282° C. and 230° C., respectively.

Example 1

The thermoplastic liquid crystal polymer film 2 obtained in Reference Example 1 and electrolytic copper foil (ten-point average roughness (Rz): 0.9 µm) with 12 µm in thickness as the metal sheet 3 were used. As shown in FIG. 2, a resin-coated metal roll ("SUPER TENPEX" produced by YURI ROLL MACHINE, CO., LTD., with resin thickness of 1.7 cm) was used as the roll 8 in contact with the thermoplastic liquid crystal polymer film 2. The thermoplastic liquid crystal polymer film 2 was arranged on the side of the resin-coated metal roll 8, and the electrolytic copper foil was arranged on the opposite side thereof. Both of the diameters of the metal roll 9 and the resin-coated metal roll 8 were 40 cm. The surface temperature of the metal roll 9 was set to a temperature 20° C. lower than the melting point of the thermoplastic liquid crystal polymer film 2. The pressure applied to the thermoplastic liquid crystal polymer film 2 and the electrolytic copper foil 3 between rolls was 120 kg/cm² as planar pressure conversion. The thermoplastic liquid crystal polymer film 2 was laid along the resin-coated metal roll 8, and the electrolytic copper foil 3 was touched to the film 2 so as to be temporarily bonded under the condition described above. Further, the adjoined object was introduced between the metal roll 9 and the resin-coated metal roll 8 so as to be compression-bonded to obtain a laminate 6. Thus obtained laminate 6 was heat-treated with an IR heating furnace having a length of 5 m in the line direction. The IR heating furnace was set to have divided temperature distributions into a dry treatment zone 16 and a heat treatment zone 17 in the heating zone so that treatment was carried out in the dry treatment zone 16 and the heat treatment zone 17. The temperature of the dry treatment zone 16 was set to 140° C. that was lower than the melting point of the thermoplastic liquid crystal polymer film 2. The machine speed was set that arbitrary one point on the laminate was passed through the dry treatment zone in IR heating furnace in 15 seconds. In this case, the drying period is 15 seconds. In the meantime the temperature of the heat treatment zone was set at 300° C. that was higher than the melting point of the thermoplastic liquid crystal polymer film 2 (heating rate: about 20° C./(second)), after carrying out the dry treatment of the laminate in the dry zone 16, the laminate was passed through the heat treatment zone 17 in 30 seconds for heat treatment to produce a metal-clad laminate 1. Table 6 shows the obtained results.

Examples 2 to 9 were obtained according to drying temperature and drying period in Table 6 with the dry zone 16 used in Example 1 so as to produce a metal-clad laminate 1.

Comparative Example 1

Except that the drying temperature in the dry zone 16 was set to 285° C., the metal-clad laminate 1 was produced in the same way as Example 3. Table 6 shows the results.

Comparative Example 2

After obtaining a laminate 6 in the same way as Example 1, the laminate was heat-treated using IR heating furnace without providing dry zone, but only the heat treatment zone was provided, so that the laminate was heat-treated. The temperature of the heat treatment zone was set to 300° C. that was the temperature higher than the melting point of the thermoplastic liquid crystal polymer film, and the laminate was passed through the heat treatment zone in 30 seconds. In this case, the laminate was heated up to the set-up temperature of 300° C. in about 60° C./second. Accordingly, the laminate was subjected to temperatures of lower than the melting point of the thermoplastic liquid crystal polymer film only in about 5 seconds. Table 6 shows the results.

Comparative Example 3

Except that the drying period was set to 3 seconds, the metal-clad laminate was produced in the same way as Example 1. Table 6 shows the results.

Comparative Example 4

Except that the heat treatment temperature was set to 280° C. that was lower than the melting point of a thermoplastic liquid crystal polymer film, the metal-clad laminate was produced in the same way as Example 1. Table 6 shows the results.

Comparative Example 5

After producing the laminate 6 in the same was as Example 3, the laminate was heat-treated in the IR heating furnace, without providing heat treatment zone, but only the dry treatment zone was provided. The temperature and period in the dry treatment zone were set in the same way as Example 3. Table 6 shows the results.

TABLE 6

|  | Cu Foil Roughness (μm) | Melting Point (° C.) | Drying Temperature (° C.) | Drying Period (Sec.) | Heat Treatment Temperature (° C.) | Blister Number | Adhesion Strength (kN/m) | Insertion Loss (db/cm) |
| --- | --- | --- | --- | --- | --- | --- | --- | --- |
| Ex. 1 | 0.9 | 282 | 140 | 15 | 300 | 0 | Good | −0.62 |
| Ex. 2 | 0.9 | 282 | 140 | 30 | 300 | 0 | Good | −0.62 |
| Ex. 3 | 0.9 | 282 | 140 | 60 | 300 | 0 | Good | −0.62 |
| Ex. 4 | 0.9 | 282 | 140 | 120 | 300 | 0 | Good | −0.62 |
| Ex. 5 | 0.9 | 282 | 150 | 30 | 300 | 0 | Good | −0.62 |
| Ex. 6 | 0.9 | 282 | 200 | 60 | 300 | 0 | Good | −0.62 |
| Ex. 7 | 0.9 | 282 | 250 | 60 | 300 | 0 | Good | −0.62 |
| Ex. 8 | 0.9 | 282 | 260 | 60 | 300 | 0 | Good | −0.62 |
| Ex. 9 | 0.9 | 282 | 275 | 60 | 300 | 0 | Good | −0.62 |
| Com. Ex. 1 | 0.9 | 282 | 285 | 60 | 300 | 54 | Poor (Tear at blister portion) | Unmeasurable |
| Com. Ex. 2 | 0.9 | 282 | — | — | 300 | 55 | Poor (Tear at blister portion) | Unmeasurable |
| Com. Ex. 3 | 0.9 | 282 | 140 | 3 | 300 | 50 | Poor (Tear at blister portion) | Unmeasurable |
| Com. Ex. 4 | 0.9 | 282 | 140 | 120 | 280 | 0 | Poor | −0.62 |
| Com. Ex. 5 | 0.9 | 282 | 140 | 60 | — | 0 | Poor | −0.62 |

In Examples 1 to 9, even if the copper foils with low roughness Rz of 0.9 μm, which conventionally had difficulty in improved adhesion strength with thermoplastic liquid crystal polymer film, were laminated to the thermoplastic liquid crystal polymer films, the obtained laminates achieved excellent adhesion strength and low insertion loss, i.e., improved high frequency characteristics.

Since the drying temperature was equal to or higher than the melting point of the thermoplastic liquid crystal polymer film in Comparative Example 1, and blisters were generated by rapid temperature increase so that the obtained laminate had poor appearance. Generated blisters brought about film breakage so that adhesion strength was poor (less than 0.4 kN/m). As a result, further measurement of insertion loss was difficult.

Since the heat treatment process was performed without performing the dry treatment in Comparative Example 2, the laminate was rapidly heated like Comparative Example 1, resulting in blister generation. Generated blisters brought about film breakage so that adhesion strength was poor (less than 0.4 kN/m). As a result, further measurement of insertion loss was difficult.

Since the drying period was as short as 3 seconds, blisters were generated in Comparative Example 3. Generated blisters brought about film breakage so that adhesion strength was poor (less than 0.4 kN/m). As a result, further measurement of insertion loss was difficult.

Although blister generation was not found in Comparative Example 4 because of the dry treatment, since the heat treatment temperature was lower than the melting point, adhesion strength was poor (less than 0.4 kN/m).

Since the heat treatment was not carried out after the dry treatment in Comparative Example 5, adhesion strength was poor (less than 0.4 kN/m).

INDUSTRIAL APPLICABILITY

As explained above, according to the present invention, the metal-clad laminates comprising thermoplastic liquid crystal polymer films can be produced in an efficient way.

The produced metal-clad laminates are excellent in high frequency characteristic, so as to be advantageously used as circuit board materials, as high frequency circuit board materials especially the substrate materials of the high frequency circuits used for a microwave millimeter wave antenna, further preferably as substrate materials used for the radar mounted in cars using microwave millimeter wave.

As described above, preferred embodiments of the present invention are shown and described. It is also to be understood that various changes, modifications, and omissions may be made without departing from the scope of the present invention and are encompassed in the scope of the claims.

DESCRIPTION OF NOTATION

1 Metal-clad laminate
2 Thermoplastic liquid crystal polymer film
3 Metal foil (metal sheet)
4 Unwinding roll
5 Unwinding roll
6 Laminate
7 Heating roll
8 Heat resistant rubber roll
9 Heating metal roll
10 Continuous heat-press apparatus
11 Nip roll
16 Dry treatment means, dry treatment zone
17 Heat treatment means, heat treatment zone
13 Winding roll
15 Laminate
20 Metal-clad laminate
30 Continuous heat-press apparatus

What is claimed is:

1. A metal-clad laminate comprising a thermoplastic liquid crystal polymer film and a metal sheet(s) bonded to at least one surface of the thermoplastic liquid crystal polymer film, wherein
    a molecular orientation of a skin layer of the film forming the at least one surface of the thermoplastic liquid crystal polymer film and a core layer within the thermoplastic liquid crystal polymer film are the same, as imparted by heat-treating the laminate at a heating temperature equal to or higher than the melting point (Tm)+11° C. of the thermoplastic liquid crystal polymer film,
    the metal sheet has a surface with a ten-point average roughness (Rz) of 5.0 μm or less bonded to the thermoplastic liquid crystal polymer film,
    a peel strength of the thermoplastic liquid crystal polymer film from the metal sheet bonded to the thermoplastic liquid crystal polymer film is 0.7 kN/m or greater, and
    an average number of blisters of the laminate per 1 m² is 20 or less.

2. The metal-clad laminate according to claim 1, wherein the metal sheet has a surface with a ten-point average roughness (Rz) of 2.0 μM or less to be bonded to the thermoplastic liquid crystal polymer film.

3. The metal-clad laminate according to claim 1, wherein the thermoplastic liquid crystal polymer film has a thickness in a range of from 10 to 500 μm and the metal sheet has a single layer thickness in a range of from 6 to 200 μm.

4. A method for producing the metal-clad laminate according to claim 1, using roll-to-roll processing, the method comprising:
    preparing the laminate comprising the metal sheet(s) bonded to the thermoplastic liquid crystal polymer film,
    dry-treating the laminate by subjecting the laminate passed through a dry zone satisfying the following conditions (1) and (2):
        (1) the dry treatment is carried out at a drying temperature of lower than the melting point of the thermoplastic liquid crystal polymer film (Tm),
        (2) the dry treatment is carried out for a drying time of 10 seconds or longer,
    and
    heat-treating the dried laminate by subjecting the laminate passed through a heating zone on at a heat zone at a heating temperature equal to or higher than the melting point Tm +11° C. of the thermoplastic liquid crystal polymer film successively after the dry treatment.

5. The production method according to claim 4, wherein the metal sheet has a surface with a ten-point average roughness (Rz) of 2.0 μm or less on the side in contact with the thermoplastic liquid crystal polymer film.

6. The production method according to claim 4, wherein a value obtained by multiplying the drying temperature (° C.) and drying time (second) is from 1400 to 30000.

7. The production method according to claim 4, wherein a heating rate of the thermoplastic liquid crystal polymer film surface in the heat treatment is in a range of from 3 to 80° C./second.

8. The production method according to claim 4, wherein the drying temperature is in a range from 140° C. to Tm−5° C., and a heating temperature is equal to or lower than Tm+50° C.

9. The production method according to claim 4, wherein the heating temperature is equal to or lower than Tm+30° C.

10. The production method according to claim 4, wherein the thermoplastic liquid crystal polymer film has a thickness in a range of from 10 to 500 μm, and the metal sheet has a thickness in a range of from 6 to 200 μm.

11. The production method according to claim 4, wherein a ratio of the thickness (μm) relative to the surface roughness (μm) of the metal sheet is (thickness)/(surface roughness) =200/1 to 50/1.

* * * * *